United States Patent [19]

Buonocore

[11] Patent Number: 4,651,096

[45] Date of Patent: Mar. 17, 1987

[54] IMAGING METHOD FOR NUCLEAR MAGNETIC RESONANCE UTILIZING BALANCED GRADIENT FIELDS

[75] Inventor: Michael H. Buonocore, Redwood City, Calif.

[73] Assignee: Resonex, Sunnyvale, Calif.

[21] Appl. No.: 702,966

[22] Filed: Feb. 19, 1985

[51] Int. Cl.[4] ............................................. G01R 33/20
[52] U.S. Cl. ...................................... 324/309; 324/307
[58] Field of Search ............... 324/307, 309, 310, 314; 128/653

[56] References Cited

U.S. PATENT DOCUMENTS 4,165,479  8/1979  Mansfield ............................ 324/309
4,509,015  4/1985  Ordidge et al. ..................... 324/307
4,527,124  7/1985  van Uijen ............................ 324/309

OTHER PUBLICATIONS

Crooks et al., "Nuclear Magnetic Resonance Whole-Body Imager Operating at 3.5 KGauss", Radiology, vol. 143, No. 1, Apr., 1982.

Primary Examiner—Stewart J. Levy
Assistant Examiner—Kevin D. O'Shea
Attorney, Agent, or Firm—Flehr, Hohbach, Test, Albritton & Herbert

[57] ABSTRACT

There is disclosed an improved NMR imaging method utilized for forming images of a subject by determining the relative densities of nuclei within the subject. A main magnetic field is applied to the subject to create aligned nuclear spins in the nuclei. Radio frequency energy is applied to the subject at a predetermined Larmor frequency to create a radio frequency field acting in a direction substantially perpendicular to the main magnetic field. A gradient magnetic field is applied to the subject along a selected axis at a time substantially coincident to the time of application of the radio frequency energy so that the nuclei in only a thin slice of the subject are excited. The application of radio frequency energy is terminated after a predetermined time. Thereafter, two time varying balanced gradient magnetic fields are applied to the subject along two perpendicular axes, which are both perpendicular to the first magnetic gradient field. The resulting precession of the nuclear spins is detected during substantially the entire time of the free induction decay period of the spins. An image is then formed from the detected information. These steps are repeated so that many slices of the subject are imaged substantially simultaneously.

31 Claims, 8 Drawing Figures

SEQUENCE, MULTISLICE

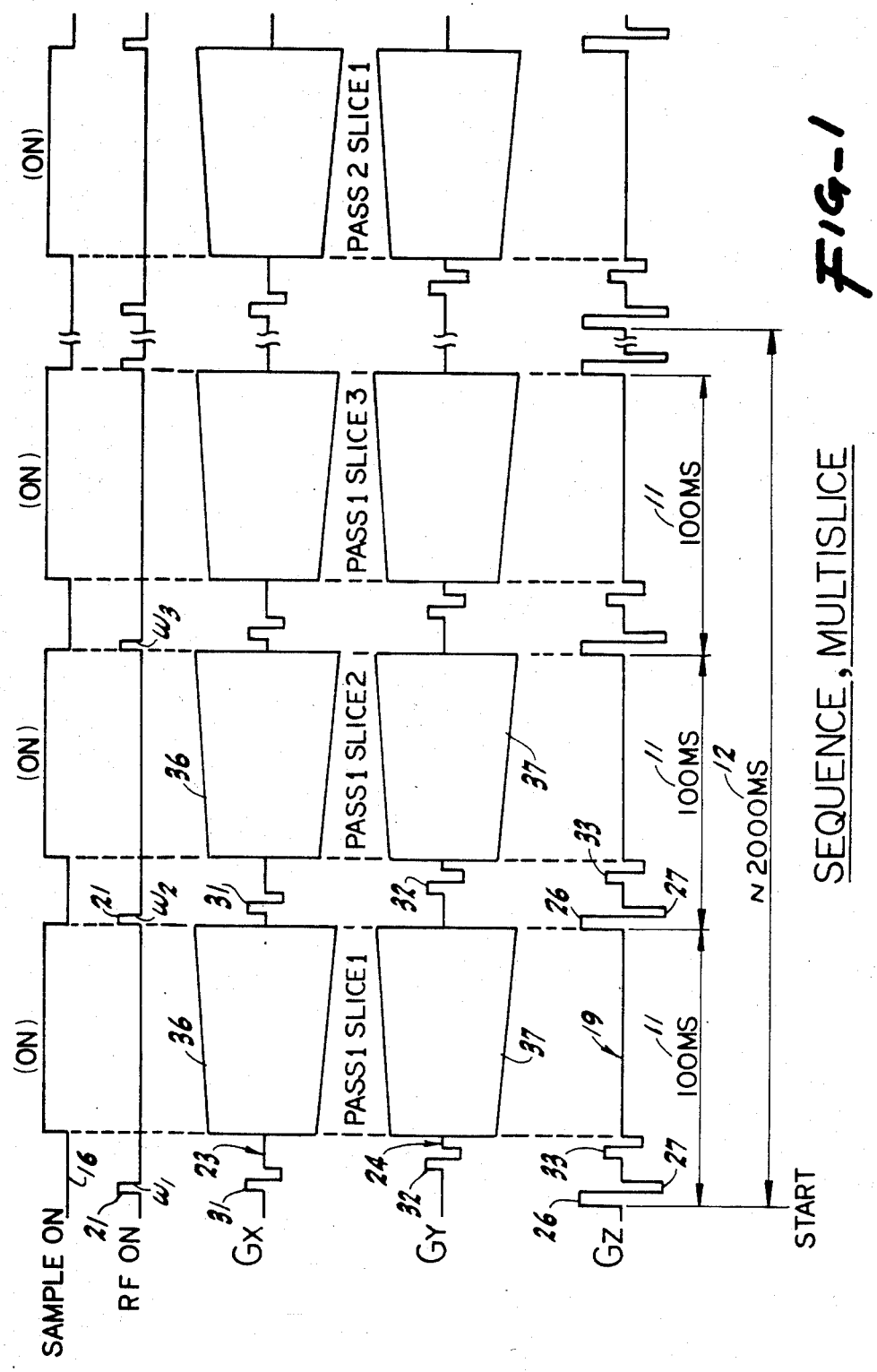

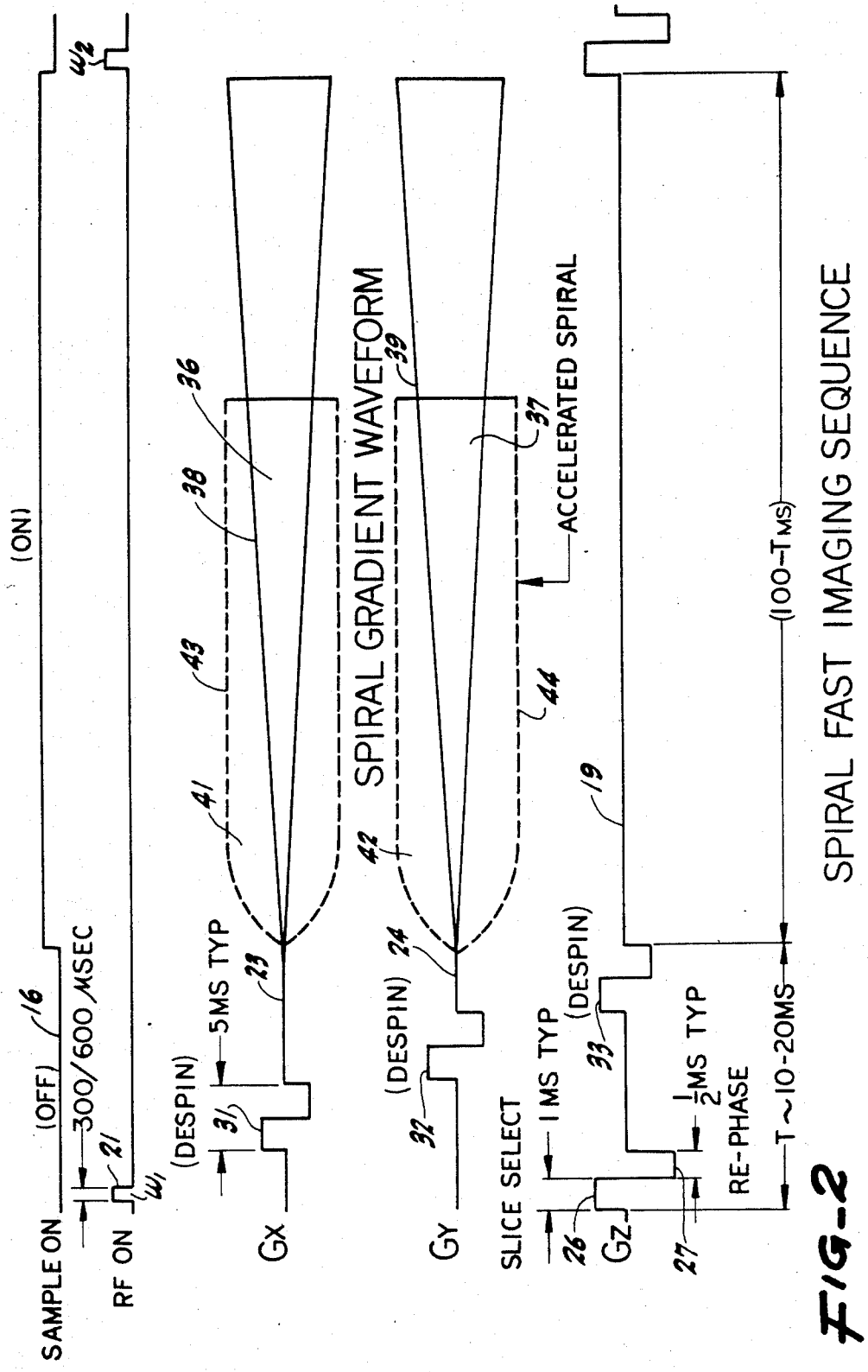
FIG-2  SPIRAL FAST IMAGING SEQUENCE

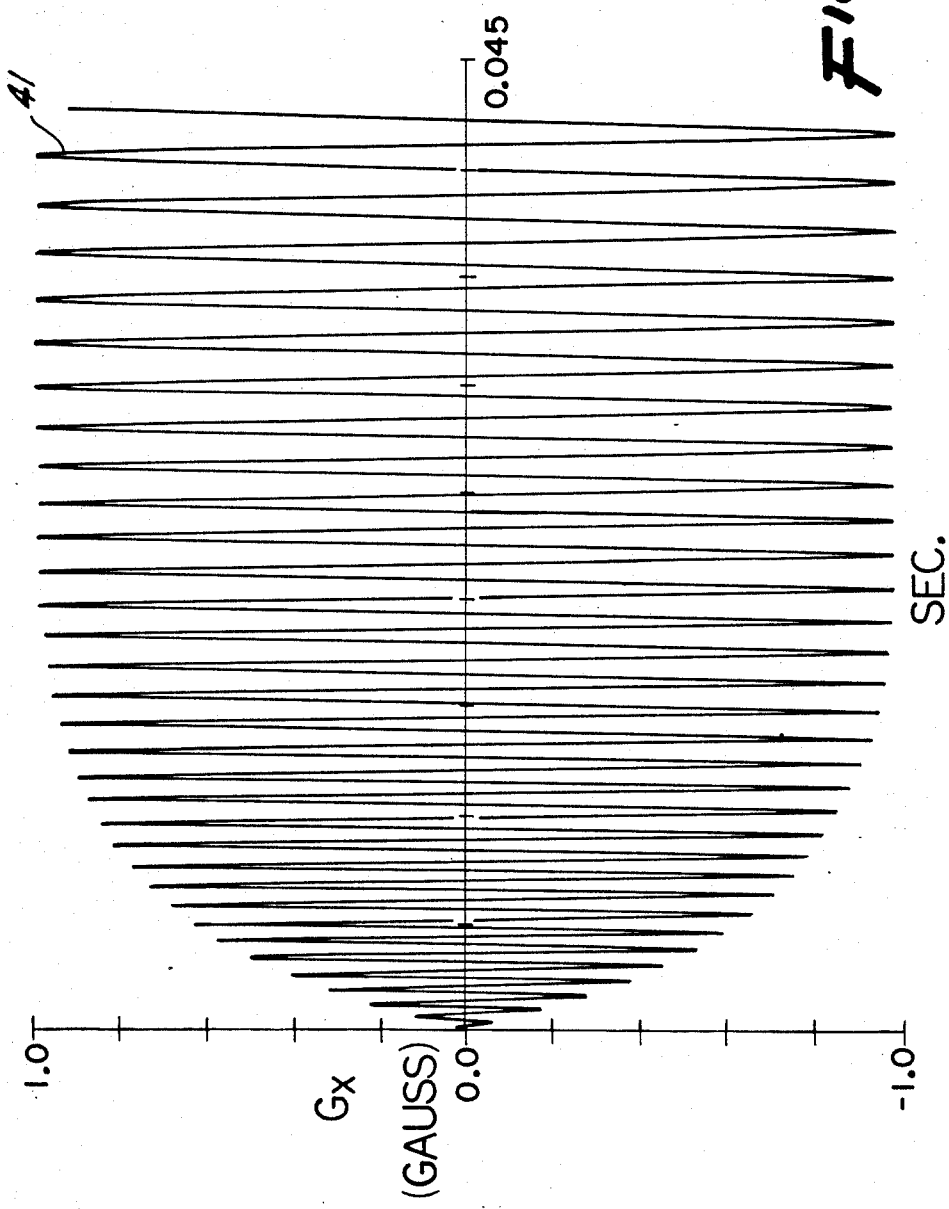

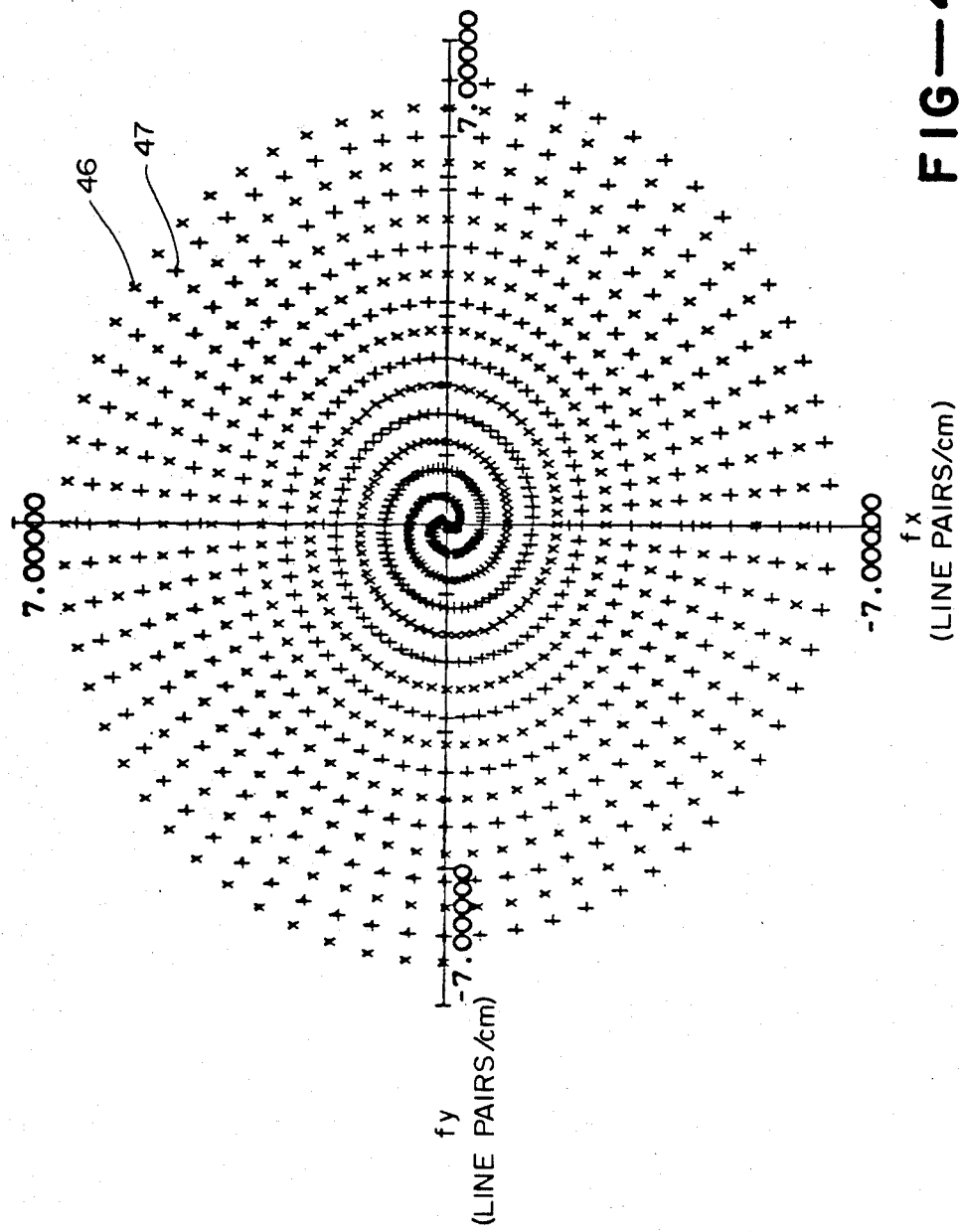

IMAGING METHOD FOR NUCLEAR MAGNETIC RESONANCE UTILIZING BALANCED GRADIENT FIELDS

This invention relates to an imaging method for nuclear magnetic resonance utilizing balanced gradient fields in which data is collected over substantially the entire free induction decay period.

In the past many methods have been developed for forming images of the human body utilizing nuclear magnetic resonance. A large list of pertinent patents and other publications is disclosed in U.S. Pat. No. 4,297,637 (Crooks et al., 1981). Of particular interest in connection with the present invention are the publications of P. Mansfield listed in said U.S. Pat. No. 4,297,637. Mansfield discloses the use of unbalanced gradient fields. Also of interest are two publications of Ching-Ming Lai, one entitled "Reconstructing NMR Images Under Magnetic Fields With Large Inhomogenities" and the other entitled "Reconstructing NMR Images From Projections Under Inhomogeneous Fields and Non-Linear Field Gradients", appearing respectively in *J. Physics E: Sci. Instrum,* 1982, Vol. 15, pages 1093–1100 and *Physical and Medical Biology* 1983, Vol. 28, No. 8, pages 925–938. Lai discloses techniques for reconstructing NMR images to correct for inhomogenities in magnetic fields. In the past, extensive efforts have been made to minimize inhomogeneties in the main magnetic field and nonlinearities in the gradient magnetic fields utilized in NMR imaging systems. Such efforts have often led to the use of expensive superconducting magnets. In addition, even with the use of such superconducting magnets, it has been difficult to form good images of small vessels in the human body, as for example, blood vessels associated with the heart and in the brain. There is therefore a need for a new and improved method which makes it possible to image small vessels utilizing nuclear magnetic resonance and still making it possible to utilize magnetic fields which have inhomogeneities.

In general, it is an object of the present invention to provide an imaging method for nuclear magnetic resonance utilizing balanced gradient fields.

Another object of the invention is to provide a method of the above character in which data can be collected during substantially the entire free induction decay period.

Another object of the invention is to provide a method of the above character in which the imaging time is decreased by a factor of 16 or more.

Another object of the invention is to provide a method of the above character which lends itself to use with inexpensive resistive magnet structures.

Another object of the invention is to provide a method of the above character in which the data is collected in a spiral fashion in a preselected spatial frequency plane without exceeding a predetermined maximum $f_x$ and $f_y$.

Another object of the invention is to provide a method of the above character which can be utilized to provide fast imaging.

Another object of the invention is to provide a method of the above character which makes it possible to readily correct for non-uniformities in the main magnetic field.

Another object of the invention is to provide a method of the above character in which a modified convolution back projection process is utilized for error corrections to eliminate or minimize the effect of non-uniformities in the main magnetic field.

Another object of the invention is to provide a method of the above character in which corrections can be made for non-linearities in the gradient magnetic fields.

Another object of the invention is to provide a method of the above character which minimizes the effect of T2 noise on the quality of the images generated.

In summary, the method of the present invention is utilized for forming images of a subject by determining the relative densities of nuclei within the subject. A main magnetic field is applied to the subject to create aligned nuclear spins in the nuclei. Radio frequency energy is applied to the subject at a predetermined Larmor frequency to create a radio frequency field acting in a direction substantially perpendicular to the main magnetic field. A gradient magnetic field is applied to the subject along a selected axis at a time substantially coincident to the time of application of the radio frequency energy so that the nuclei in only a thin slice of the subject are excited. The application of radio frequency energy is terminated after a predetermined time. Thereafter, two time varying balanced gradient magnetic fields are applied to the subject along two perpendicular axes, which are both perpendicular to the first magnetic gradient field. The resulting precession of the nuclear spins is detected during substantially the entire time of the free induction decay period of the spins. An image is then formed from the detected information. These steps are repeated so that many slices of the subject are imaged substantially simultaneously.

Additional objects and features of the invention will appear from the following description in which the preferred embodiment is set forth in detail in conjunction with the accompanying drawings.

FIG. 1 is a graph showing a multislice imaging sequence utilized in conjunction with the method of the present invention.

FIG. 2 is an enlarged detail view of a portion of the graph shown in FIG. 1 showing the magnetic gradient signal sequence utilized in the method of the present invention.

FIG. 3B is a graph similar to that shown in FIG. 3A but shows utilization of an accelerated spiral gradient waveform.

FIG. 4 is a graph showing the manner in which spirals are interleaved and in particular shows two separate but interwoven spirals which are produced in accordance with the method of the present invention.

Figure 3A:
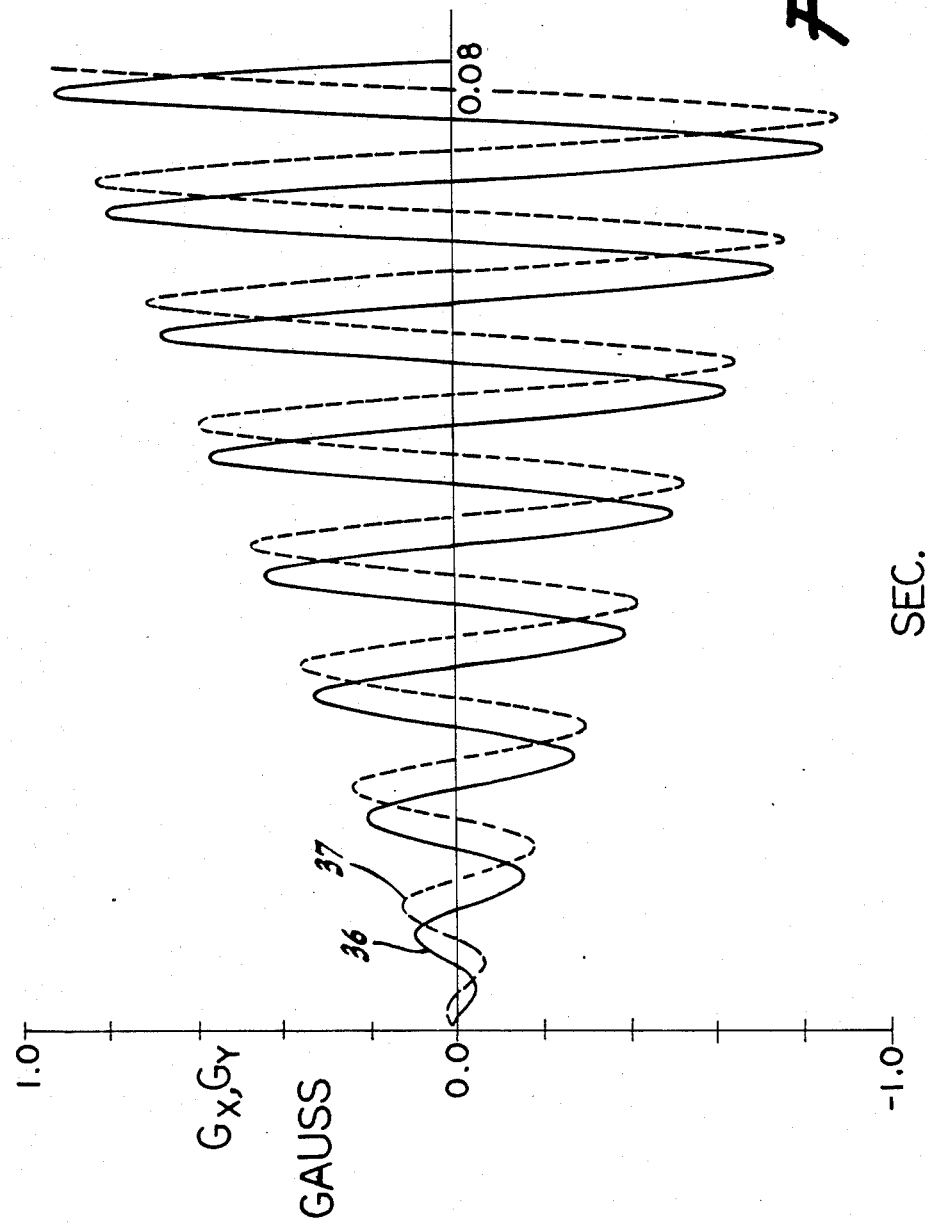
FIG. 3A is a graph showing a typical spiral gradient waveform for the $G_x$ and $G_y$ gradients utilized in the method of the present invention.

The term "free induction decay period" is used herein to refer to the T2 relaxation period (also called the transverse or spin-spin relaxation period) during which a free induction decay signal can be detected.

The terms "inhomogeneities" and "nonuniformities" are equivalent and are used interchangeably herein.

One of the primary aspects of the present invention is the use of "balanced" magnetic gradient waveforms. As is well known to those skilled in the art, magnetic gradient fields can be used to control the spatial frequency of the spin data collected in an NMR system. It is also well known that spin data must be collected from a large number of spatial frequencies to generate a reconstructed image of a subject. As will be explained below, the use of balanced magnetic gradient waveforms enables the collection of data from substantially more spatial frequencies during each free induction decay period than was possible using prior art techniques, and thus the invention greatly shortens the amount of time required for the NMR data collection and imaging process. Another aspect of the invention (which is explained with reference to FIG. 1) speeds the NMR imaging process in another way: by overlapping the time periods used for imaging several slices of a subject.

The method of the present invention can be utilized with conventional apparatus and systems utilized for nuclear magnetic resonance imaging. Since apparatus and systems of this type are well known they will not be described in detail. Typically such NMR apparatus includes a main magnet which generates the static magnetic field required for polarization of the nuclei in the subject. Such main magnetic field magnets can also be of various types. For example, they can utilize an electrically excited air core or iron core in which the conductor can be of a resistive type formed of copper or aluminum or a super conducting conductor which is cyrogenically cooled. Typically the main magnets provide a generally radially symmetrical field about the subject with the subject being centered along the direction of the field.

The apparatus and system also includes a gradient system utilized for producing spatial linear field gradients. These gradient fields are conventionally established by the use of a set of three orthogonal direct current coils which generate the three principal gradients $G_x$, $G_y$, and $G_z$. Typically the gradient coils are driven by their own power supplies which can be switched under computer control.

The apparatus and system also includes radio frequency coils which are used for generating a radio frequency field in the subject being analyzed and for picking up the free induction decay signal which is generated after termination of the radio frequency pulse. The radio frequency coils can take any desired shape, as for example, they can be saddle shaped in such a manner so that the field created acts perpendicularly to the main magnetic field. In such a system, it has been common to utilize a single coil which serves for both excitation and detection. Alternatively separate orthogonal transmitter and receiver coils also can be utilized. The system also includes a transmitter for generating highly stable radio frequency energy to provide pulse excitation to the radio frequency coils. A receiver is provided in such a system for receiving the small microvolt free induction decay signals generated by the subject. Thereafter, the free induction decay signal is digitized in an analog to digital converter and then stored in a memory section of the computer. Typically a large number of these free induction decay signals are collected in forming an image. The computer computes and thereby generates a reconstructed image of the subject in terms of individual pixel values which can be displayed on a conventional cathode ray tube for viewing.

For reasons that are well known to those familiar with NMR imaging and instrumentation, a spin echo signal is often used instead of the free induction decay signal for data collection. The present invention is equally applicable to systems using data from either a free induction decay signal or a spin echo signal. Therefore, for convenience, for purposes of the present invention the term "free induction decay signal" is defined to mean "either a free induction decay signal or a spin echo signal, whichever the user of the system selects".

Referring to FIG. 1, the multislice imaging aspect of the method of the present invention is now described in conjunction with the graph shown in FIG. 1. The timing sequence is broken up into a plurality of time intervals 11, and a plurality of groups of time intervals called passes 12. For example, each time interval 11 shown in FIG. 1 is 100 milliseconds long and each pass 12 is 2000 milliseconds or two seconds so as to provide 20 time intervals during each pass 12.

Multislice imaging is only one aspect of the present invention. The method of the present invention is not limited to the imaging a plurality of slices. In the case of single slice imaging, interval 11 and pass 12 are equal in time duration (which may vary from 100 milliseconds to 2000 milliseconds).

Data is collected from a different slice of a subject during each time interval 11. For example, data can be collected from 20 parallel slices of a subject during each pass 12. During each succeeding pass more data can be collected from each slice to provide the desired resolution for the images to be formed. The number of time intervals 11 used per pass depends primarily on the number of slices of the subject to be imaged.

Each time interval 11 is of a suitable length for collecting data from a single slice of a subject. This is generally slightly longer than the useful data collection time after an excitation pulse, which is generally determined by the T2 or spin-spin degradation of the free induction signal generated by the subject.

In general, it is a feature of the present invention that data can be collected from a plurality of selected slices of a subject during a period of time which is no longer than the average spin-lattice relaxation time (often denoted as T1) associated with the slices of the subject which are being imaged. In the prior art methods known to the inventor, data is collected from only one slice of a subject during each spin-relation period.

In FIG. 1 the intervals 11 are denoted as pass 1, slice 1, pass 1, slice 2, pass 1, slice 3, . . . pass 2, slice 1, et cetera. If the resolution of the image to be reconstructed requires more data, as soon as the first pass has been completed, a second pass 12 is commenced and data is collected starting with slice 1 again. The rate at which the passes are performed constitutes the repetition rate for the data collection from the subject. The repetition rate will generally provide enough time so that the spins in each slice will have relaxed sufficiently so that the effects of the previous pass will not substantially effect the data collection process in the next pass.

In accordance with another aspect of the invention to be discussed below, the number of such time intervals 11 needed to collect enough data to generate an image with a specified resolution is considerably less when using the method of the invention than when using prior art methods.

The relative timing of the various steps of the method of the present invention can now be described in conjunction with the time intervals 11 and the passes 12. The square wave 16 indicates when data is being collected. It is collected during the "ON" portions and not collected during the "OFF" portions. The main magnetic field is applied continuously and is substantially static and uniform, except as described below. Typically it can have a strength ranging from 0.15 to 2.0 Tesla.

At the beginning of each time interval 11, a radio frequency (RF) field is applied to the subject in the form of a pulse 21 in a direction which is at right angles to the main field. As is conventional in NMR imaging systems, the angular frequency of the RF field is the Larmor frequency w in which $$w = \gamma^* B \quad (1)$$

where $\gamma$ is a physical constant equal to 4257 hertz per gauss for hydrogen nuclei, and B is the magnitude of the magnetic field at the position of the nuclei (i.e., of the nuclei in the slice being imaged). The angular frequency of the RF pulse for the different slices are denoted w1, w2, w3 and so on to indicate that the frequency used for each slice is different. Typically, the RF pulse frequency used will ascend or descend in preselected increments from slice to slice.

The $G_z$ gradient field is applied to the subject simultaneously with the application of the RF pulse 21. The combination of applying a $G_z$ gradient field with an RF field will select a particular slice in the subject. The position of the slice is ascertained by $$z = (f/(\gamma^* G_z)) - B_o/G_z \quad (2)$$

where z is the distance from the slice to where the $G_z$ magnetic field is zero; f is the frequency of the RF pulse 21; $G_z$ is the gradient magnetic field along the z axis, which is perpendicular to the selected slice; and $B_o$ is the strength of the main magnetic field.

The RF excitation pulses 21 applied to the subject cause the spins of the nuclei in the selected slice to rotate 90° with respect to the main magnetic field, but do not rotate the spins of the nuclei elsewhere in the subject.

Before imaging is commenced, the $G_z$ gradient field is applied in the manner hereinbefore described. The first portion of the gradient field is in the form of a positively going square wave 26 which serves to select the slice as hereinbefore described. The next portion of the gradient field is in the form of a negative going square wave 27 which serves as a re-phasing pulse. This negative going pulse 27 following the positive going pulse 26 serves to re-phase the spins of the nuclei which have been flipped. As is well known to those skilled in the art, the spins have a tendency to flip as the gradient field $G_z$ is applied. It is for this reason that the negative going square wave 27 is provided to reverse the direction of the gradient field and to bring the spins back into synchronization or, in other words, to rephase.

After the slice has been selected and re-phasing has been accomplished by application of the $G_z$ gradient field, de-spin pulses 31, 32 and 33 are selectively and sequentially applied to the gradient fields $G_x$, $G_y$, and $G_z$. The de-spin pulses 31, 32 and 33 are preferably in the form of square waves having a positive going part and a negative going part which are shaped so that the total area of the waveform for each de-spin pulse is substantially zero. The purpose of the de-spin pulses is to damp out the free induction signal associated with nuclei that are moving (e.g., nuclei moving through blood vessels) without affecting the the nuclei associated with stationary tissue in the subject being imaged. The de-spin pulses can each extend over a suitable period of time, as for example, five milliseconds.

After the de-spin pulses 31, 32, and 33 have been applied to the gradient fields $G_x$, $G_y$, and $G_z$, data collection and imaging can commence. This imaging takes place during the period of time represented by the boxes 36 and 37 for the $G_x$ and $G_y$ gradient fields shown in FIG. 1 and typically represent an interval of time ranging from approximately 30 to 90 milliseconds. During this 30 to 90 millisecond time interval any one of a number of different imaging gradient and RF pulsing sequences can be utilized as will be described below.

In summary, during each successive time interval 11 an RF pulse 21 and a slice select pulse 26 are applied simultaneously to cause selection of another slice in a plane parallel to the previously selected slice but spaced relatively close thereto. De-spin pulses 31, 32 and 33 are then applied respectively in sequence to the gradient fields $G_x$, $G_y$, and $G_z$ after which imaging can again commence as represented in the boxes 36 and 37 (see, for example, pass 1, slice 2). In selecting each different slice a different RF pulse frequency is utilized. It is readily apparent that if images of additional slices are desired, they can be obtained merely by extending the length of time covered by the period 12. Also, as stated earlier, the number of passes in which images are taken depends upon the resolution desired.

FIG. 2 shows in somewhat greater detail what occurs within the open boxes 36 and 37 (shown in FIG. 1) in accordance with the method of the present invention. FIG. 2 also shows in more detail the slice selection and de-spinning operations which are performed before image generation. It can be seen that the radio frequency pulses 21 are applied for a period of time ranging from 300 to 600 microseconds and that the de-spinning pulses 31-33 are applied for a period of approximately five milliseconds each. Thus it can be seen that the total time required for slice selection and for application of the de-spinning pulses is typically approximately 15 milliseconds and can range from 5 to 20 milliseconds.

In an alternate embodiment of the present invention, de-spinning pulses are not used, thereby reducing the pre-data collection portion of each time interval 11 to just 300 to 600 microseconds. In this alternate method, blood flow turbulence during the data collection time period is relied upon to kill or at least substantially reduce any signals which may arise from moving spins. Since the purpose of the de-spin pulses 31-33 is to increase the contrast between stationary tissue and non-stationary tissue (such as blood flowing in blood vessels), if natural blood flow turbulence already sufficiently reduces the signal from moving spins to produce an acceptable level of contrast, the use of the de-spin pulses can be avoided.

In accordance with the present method, the imaging information is obtained during the approximately 80 milliseconds remaining in the timing interval after the de-spinning pulses have been applied. During this imaging period, both the $G_x$ and $G_y$ gradient fields are varied sinusoidally. The sinusoidal waveforms are represented by boxes 36 and 37 in FIG. 2. As will be explained in greater detail below, the waveforms 36 and 37 are "balanced" and are of increasing amplitude, but are 90° out of phase with each other.

The outer envelopes of a first preferred embodiment of these waveforms 36 and 37 are represented by the triangles 38 and 39 shown in FIG. 2. The outer envelopes of a second preferred embodiment of the $G_x$ and $G_y$ waveforms 41 and 42 used during data collection are represented by the bullet shaped boxes 43 and 44 shown in FIG. 2. For reasons which are explained below, these $G_x$ and $G_y$ waveforms 41 and 42 are called accelerated gradient waveforms because their use speeds up to data collection and imaging process. These waveforms 41 and 42 are also sinusoidal in shape, but have outer envelopes 43 and 44 which are substantially bullet shaped as shown by the dotted lines.

In FIG. 3A, the waveforms 36 and 37 which represent the $G_x$ and $G_y$ gradient fields respectively are shown. The waveform 36 representing the $G_x$ gradient is in solid lines whereas the waveform 37 representing the $G_y$ gradient is shown in broken lines. It can be seen that both waveforms are increasing linearly in amplitude with respect to time with a maximum amplitude of approximately 1 gauss. Although the two waveforms are 90° out of phase with each other, they are balanced and of equal magnitude. As will be explained in more detail below, when these two gradient waveforms are applied along the x and y axes of the selected plane, they serve to create a magnetic field pattern, herein called a spiral spatial frequency pattern, which defines the context in which data is collected for generating images.

The equations for these waveforms 36 and 37 can be set forth as follows:

$$G_x = k(\cos(tw - phi) - tw^* \sin(tw - phi)) \quad (3)$$

$$G_y = k(\sin(tw - phi) + tw^* \cos(tw - phi)) \quad (4)$$

where
 k is a constant related to the maximum amplitude of the $G_x$ and $G_y$ functions;
 t is the time;
 w is the angular velocity of the waveform; and
 phi is the initial angular position which can be assumed to be zero.

From these equations and from the waveforms shown in FIG. 3 it can be seen that the $G_x$ and $G_y$ gradient waveforms are substantially perfectly balanced with respect to each other. In other words these waveforms are time varying waveforms of equal magnitude and the phases of the two waveforms have a predefined relationship (e.g., in the preferred embodiment the waveforms are 90° out of phase with each other).

The shape of the $G_x$ and $G_y$ gradient waveforms needed to generate a selected image and timing of the collection of data for generating the image can be ascertained by utilizing the following procedure.

1. The following parameters must be selected in accordance with the physical constraints on the system being used, the size of the object which is being viewed, and the resolution of the image which is needed
  a. dX = desired resolution (e.g., .2 cm)
    Set fmax = 1/(2 * dX)
    E.g., if dX = .2 cm,
    then fmax = 2.5 lines pairs/cm.
  b. df = 1/spatial extent of the object
    E.g., if spatial extent is 20 cm, then df = .05 line pairs/cm.
  c. mg = maximum gradient frequency which gradient generator can generate
    E.g., mg = 1000 hz
  d. Gmax = maximum gradient amplitude which gradient generator can generate
    E.g., Gmax = 1 gauss/cm
  e. n.spokes = i * pts/spoke
    where:
      i = integer between 1 and 8, preferably 4 or 8
      pts/spoke = fmax/df
      E.g., if fmax = 2.5 line pairs/cm and df = .05 line pairs/cm
      then pts/spoke = 500
      and n.spokes = 2000 or 4000.
  f. tmax = maximum length of time data can be collected in a single data collection run
    E.g., tmax = 80 msec
2. Given the above parameters, the steps of the calculation are as follows:
  a. k = fmax/($\gamma$ * tmax)
    where $\gamma$ = 4257 hz/gauss
    E.g., if fmax = 2.5 line pairs/cm and tmax = 80 milliseconds,
    then k = 2.5/(4257 * .08)
      = .00734 gauss/cm
  b. n.turns.max = $\frac{1}{2\pi}$ ((Gmax/k)$^2$ − 1)$^{\frac{1}{2}}$
  c. max.turns = maximum number of turns/spiral in tmax
    = tmax * mg
    = .08 * 1000 = 80
  d. if max.turns is less than n.turns.max then set n.turns.max = max turns
  e. if n.turns.max is less than 1, then only one spiral is needed and use of spiral is not the optimal method of imaging. If n.turns.max is greater than 1 continue as follows:
  f. find the largest integer n which is less than or equal to n.turns.max which can be factored into pts/spoke.
    n.turns.used = n
  g. The number of data collection periods needed to collect enough data to generate the specified image is
    n.spirals = pts/spoke/n.turns.used
  h. G = k (1 + (2$\pi$ n.turns.used)$^2$)$^{\frac{1}{2}}$
  i. w = 2$\pi$ freq = 2$\pi$ n.turns.used/tmax
  j. $G_x$ = k (cos(tw − phi) − tw * sin(tw − phi))
  k. $G_y$ = k (sin(tw − phi) + tw * cos(tw − phi))
  l. The number of data points collected per data collection period is equal to n.spokes * pts/spoke/n.spirals
  m. The time interval between data samples is 2$\pi$ * n.spokes/w From the foregoing it can be seen how the "k" and "w" parameters needed for the $G_x$ and $G_y$ gradient functions can be obtained. It also can be seen that these calculations are based on the physical constraints of the apparatus utilized (e.g., the mg and Gmax parameters), the size of the object to be imaged, the number of pixels in the image to be generated (e.g. an array of 256 by 256 pixels) and the resolution of the image needed. The calculations are also based upon the length of time data is to be collected (T), which can be as long as the entire free induction decay period.

The foregoing calculation also shows how the number of data points needed and the time interval between data samples can be ascertained. Furthermore, when more than one data collection period is needed, the waveforms used during each data collection period are identical except that a different initial phase phi is used during each period. Generally, the initial phases used are evenly distributed so that the resulting data collection points from all the data collection periods are evenly spaced.

In FIG. 4 there is shown a spatial frequency diagram in which two spirals 46 and 47 are interleaved. The spiral 46 is designated by x's whereas the other spiral 47 is designated by plus signs.

Spiral 47 is a plot of $f_x$ against $f_y$ where $f_x$ is the integral of $G_x$ with respect to time and $f_y$ is the integral of $G_y$ with respect to time. $F_x$ and $f_y$ are spatial frequency functions, which are measured in units of line pairs/cm. Given the expressions for $G_x$ and $G_y$ as defined in equations 2 and 3 above, $$f_x = \gamma k t^* \cos(wt - phi) \quad (5)$$

$$f_y = \gamma k t^* \sin(wt - phi) \quad (6)$$

where $\gamma$, k, w and phi are as defined above.

Combining the above formulas, the phase $\phi$ of the spins at any selected x, y location is:

$$\phi = \gamma(B_0 + x(kt^* \cos(wt - phi)) + y(kt^* \sin(wt - phi))) \quad (7)$$

where $B_o$ is the the main magnetic field.

Each "+" of spiral 47 represents a data point. That is, the amplitude of the free induction decay spin signal generated by the subject is measured and collected at times corresponding to each of the spatial frequency locations marked by a "+" sign.

One purpose and advantage of the spiral waveform is that data can be taken at a large number of spatial frequencies, including data points at a multiplicity of angular positions in the spatial frequency plane, in a single free induction decay period. In other words a multiplicity of data points along a multiplicity of spokes in the spatial frequency plane can be collected during each free induction decay period.

From either one of the spirals 46 and 47 it can be seen that each spiral crosses the positive x axis eight times which corresponds to the number of oscillations of the gradient field in one timing interval, also called one data collection period, which is typically between 30 and 80 milliseconds. The spiral 47 is merely 180° out of phase with the spiral 46.

FIG. 3B shows the accelerated gradient waveform 41. This waveform is created by a non-linear transformation of the time scale of waveform 36. The goal of this transformation is to collect data from all the data points along the spiral waveform (see FIG. 4) in the shortest amount of time possible, and to thereby minimize the effect of T2 noise on the quality of the image generated. The transformation requires maximizing the amplitude of the gradient waveforms. However, it is a physical fact that the coils used to generate magnetic gradients have (1) a maximum gradient amplitude which can be generated; and (2) a characteristic impedance. Therefore the gradient coils cannot be instantaneously turned on to a specified amplitude.

The impedance of the coils dictates that the maximum achievable gradient at any time T can be written as:

$$\sqrt{G_x^2 + G_y^2} = G(1 - e^{-aT}) \quad (8)$$

where a is a constant related to the impedance of the gradient coils and G is the maximum combined amplitude of the gradients which can be generated.

To accomplish the translation from the first gradient waveform to the accelerated waveform one must translate the time parameter t in equations 3 and 4 from "spiral time", t, to "lab time", T. As can be easily derived by anyone skilled in the art, this time transformation is governed by the mathematical formulation:

$$G(1 - e^{-aT}) = (dt/dT)k(1 + w^2 t^2(T))^{\frac{1}{2}} \quad (9)$$

the solution to which is:

$$T + (1/a)(e^{-aT} - 1) = (k/2wG)(\sinh^{-1}(wt) + wt\sqrt{1 + w^2 t^2}) \quad (10)$$

which can be numerically solved for any given value of t. Therefore, given a set $(t_n)$ of evenly spaced spiral times at which data is to be collected in order to collect data at the desired spatial frequencies, the actual lab times $(T_n)$ at which to collect data is specified by translating each time value in the set $(t_n)$ using equation 7 as shown above.

A plot of a typical $G_x$ gradient waveform satisfying the above formula is shown in FIG. 3B.

The same data can be collected with the accelerated spiral shown in FIG. 3B as in the normal spiral in FIG. 3A because the exact same spatial frequencies can be generated by both types of waveforms. That is, referring back to FIG. 4, the same spiral spatial frequency pattern is generated by both methods. The difference is that the gradient fields are increased in amplitude more rapidly by the accelerated waveform and thus the spiral spatial frequency pattern is traversed more quickly. One consequence of using the accelerated gradient waveform is that the spin data used for imaging is collected more quickly. Another consequence is that T2 noise effects, which increase as the data collection period is extended, are reduced by use of the accelerated waveform because the length of the data collection period is reduced.

Figure 5:
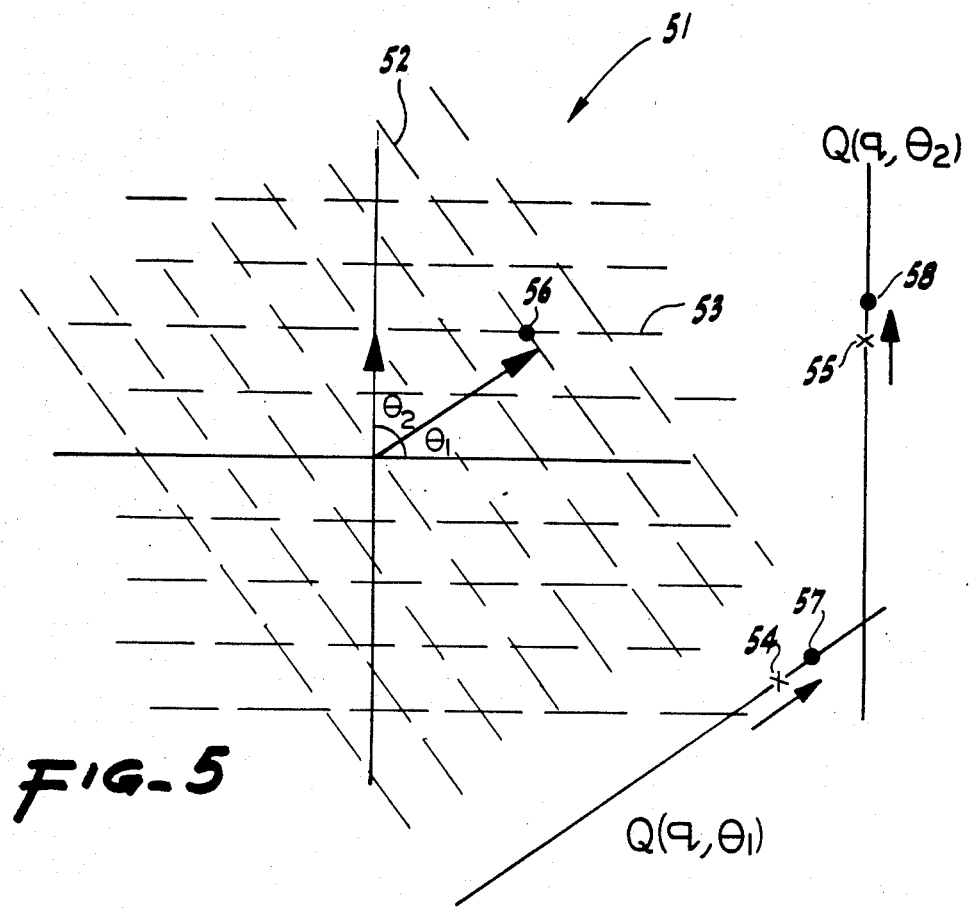
FIG. 5 is an illustration of the back projection step of a modified convolution back projection imaging method used in the preferred method of the invention.

Referring to FIG. 5, an image is generated from the free induction decay data collected using either a two dimensional Fourier transform or a modified convolution back projection. Since convolution back projection is used for imaging data expressed in polar coordinates, and in the preferred embodiment data is collected at selected angular positions in the spatial frequency plane, convolution back projection is the preferred method of image reconstruction.

The distribution of spins, $A(R,\theta)$, in the slice is observed indirectly. The observed data is represented as $S(t,\theta)$ or $S(\beta,\theta)$, where t is the time at which the data was observed, $\beta = kt$ where k is the same constant as used in equations 2 and 3, and $\theta$ is the angular position of the gradient magnetic field in the spatial frequency domain at the time the data was observed. $\beta$ is a measurement of the distance of the data point from the origin of the spatial frequency domain.

Using a standard two dimensional Fourier transform, the $S(\beta,\theta)$ and $A(R,\theta)$ functions are related as follows:

$$S(\beta,\theta) = \int_{-\infty}^{\infty} dx \int_{-\infty}^{\infty} dy A(x,y) e^{i\beta(x\cos\theta + y\sin\theta)} |\beta| \quad (11)$$

$$A(x,y) = \quad (12)$$

$$\frac{1}{2\pi} \int_0^{2\pi} d\theta \int_0^{\infty} |\beta| d\beta S(\beta,\theta) \cdot e^{-i\beta(x\cos\theta + y\sin\theta)}$$

Equation 12 is preferably rewritten using $$Q(q,\theta) = \frac{1}{2\pi} \int_0^{\infty} S(\beta,\theta)|\beta|e^{i\beta q}d\beta \quad (13)$$

where $$q = x\cos\theta + y\sin\theta$$

as $$A(x,y) = \frac{1}{2\pi} \int_0^{2\pi} d\theta \int_0^{\infty} Q(q,\theta)\delta(q - x\cos\theta - y\sin\theta) \quad (14)$$

where $\delta(x)$ is the standard delta function.

Equation 13 is a mathematical representation of the convolution portion of the imaging process and equation 14 represents the back projection portion.

Before proceeding any further, it must be noted that the $|\beta|$ factor in the convolution step (see equation 13) must generally be replaced by a function which is damped out for $\beta$ greter than $\beta o$ because the observed data does not continue forever and stopping the integration abruptly will create "ringing" in the data. Therefore a damping function is used in place of the $|\beta|$ factor. The exact damping function used is not critical as long as it is approximately equal to $\beta$ below $\beta o$ and smoothly damps out after that. One reasonable damping function is:

$$u(\beta) = |\beta|e^{-\alpha\beta^2} \quad (15)$$

where $\alpha$ is a function of the number of data points along the integration axis.

The NMR data used in any real system contains a limited number of data values. These discrete data values must be processed by using numeric integration techniques, such as Simpson's rule or Romberg's rule (which provides a fourth order approximation of the integral).

Thus the mathematical representation of the convolution step of the imaging process is:

$$Q(q_i,\theta_k) = (d\beta/2\pi) \Sigma_j w_j S(\beta_j,\theta_k) u(\beta_j)e^{i\beta_j q_i} \quad (16)$$

for each $q_i = i * $ (image size)/(pts/spoke), $i=0$ to pts/spoke where $w_j$ is a weighting factor determined by the integration method being used, and pts/spoke is the number of data points being collected along each spoke in the spatial frequency plane. This summation process is performed for each spoke (i.e., $\theta_k$) of the spiral.

The back projection step is performed by summing the projection of each spoke of the Q function on each pixel in the reconstructed image A':

$$A'(x,y) = \Sigma_{k=1}^{N} Q(q_i = x\cos\theta_k + y\sin\theta_k, \theta_k) \quad (17)$$

where $$Q(q_i = x\cos\theta_k + y\sin\theta_k, \theta_k) = aQ(q_j,\theta_k) + bQ(q_{j+1},\theta_k) \quad (18)$$

where
$q_j$ = the closest point in Q less than $q_i$
$a = (q_i - q_j)/(q_j - q_{j+1})$
$b = (q_{j+1} - q_i)/(q_j - q_{j+1})$ Still referring to FIG. 5, there is shown a graphic representation of two Q functions and their projection onto the reconstructed image 51. Each Q function is drawn as a line which is parallel to the spoke of spatial frequency data points used to generate the Q function, as explained above. The dashed lines which are perpendicular to each of the Q functions represent the projection of the Q functions onto the image being constructed 51. For instance, dashed line 52 represents the back projection of the point 54 marked with an "x" on $Q(q,\theta_1)$ onto pixel 56 in the image 51; dashed line 53 represents the back projection of the point 55 marked with an "x" on $Q(q,\theta_2)$ onto pixel 56 in the image 51.

Since the image 51 is generally formed from a grid of pixels at discrete positions, back projection is accomplished by summing the contribution of each Q function to each pixel, as defined by equations 17 and 18 above.

Continuing to refer to FIG. 5, it may be desired to utilize the method of the present invention with magnet structures which provide a main field which is not uniform. This is particularly true in the case where it is desired to utilize less expensive resistive-type magnets.

For the purposes of this discussion it is assumed that non-uniformities in the main magnetic field can be characterized as $$B_o'(x,y) = B_o + B_d(x,y) \quad (19)$$

where $B_o'$ is the actual main magnetic field, $B_o$ is the nominal or target value of the main magnetic field, and $B_d(x,y)$ is the amount of the non-uniformity at each position in the slice, measured in gauss.

Non-uniformities in the main field can be accounted for as errors in the positions of the spins. This is based partially on the facts that (1) the slice is mapped by using magnetic fields which are position dependent, and (2) a non-uniformity in the main magnetic field at position x,y causes the data from the spins at that position to be interpreted as coming from spins at a position which is displaced from their true position by a distance which is proportional to the amount of the non-uniformity in the field at that position.

The physical basis for the treatment of main field non-uniformities is as follows. First, the convolution back projection process maps particular spin phase patterns onto corresponding positions in the reconstructed image. Second, the value of each spin phase is directly determined by the accumulated effect of the time varying magnetic field on the spin.

Third, each "spoke" of the Q function, produced by the convolution step, represents the data that would have been obtained if a steady gradient had been applied during data collection. The angle of this gradient is the angle of the spoke in the spatial frequency domain; and its magnitude is k.

Four, given a constant gradient during data collection with non-uniformities in the main field, the phase of the spins at position x,y is $$\phi = \gamma^* t^* (B_o + B_d(x,y) + r^*k) \quad (20)$$

where r is the distance of position x,y from the zero point of the gradient field. This can be rewritten as $$\phi = \gamma^* t^* (B_0 + (r + B_d(x,y))/k)^* k) \quad (21)$$

Therefore a correction factor of $B_d(x,y)/k$ must be added to the $x \cos \theta + y \sin \theta$ term in back projection formula. See equation 17 and 18, where the Q term should be replaced with $$Q(q_i = x \cos \theta + y \sin \theta + B_d(x,y)/k, \theta_k) \quad (22)$$

The correction for non-uniformities is represented pictorially in FIG. 5. The projection of $Q(q,\theta_1)$ and $Q(q,\theta_2)$ onto the image 51 is shifted by the non-uniformity so that the the value of $Q(q,\theta_1)$ at point 57 and the value of $Q(q,\theta_2)$ at point 58 are now projected onto pixel 54.

Figure 6:
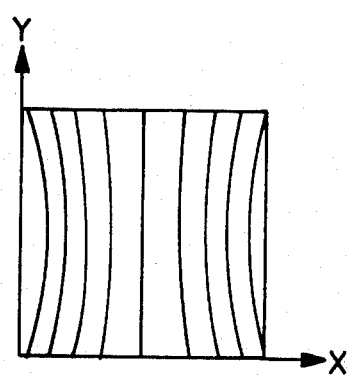
FIG. 6 is a graph showing a set of isomagnetic lines of the $G_x$ gradient field in machine coordinates.

In addition to the main magnetic field being non-uniform, it should be appreciated that the gradient fields also can be non-linear. These non-linearities in the gradient fields can also be minimized or eliminated in conjunction with the method of the present invention. Corrections for non-linearities in the gradient fields can be accomplished by mapping the gradient fields. FIG. 6 shows isomagnetic lines of a non-linear $G_x$ gradient field plotted in machine coordinates. These lines show the manner in which the image will be warped by the non-linearities in the gradient field. By utilizing the knowledge gained from mapping of the $G_x$ and $G_y$ gradients, it is possible to reconstruct the image which has been created by using compensating techniques which dewarp the image in the same manner as it was warped by the non-linearities of the $G_x$ and $G_y$ gradient fields.

However, as an initial matter it is preferable to first determine if the non-linearities significantly degrade the image being generated. In many instances the warping will not be significant and the dewarping correction step can be avoided.

For the purposes of this discussion it is assumed that non-linearities in the gradient magnetic fields can be characterized as $$G_x(X,Y,t) = (1 + E_x(X,Y))^* G_x(t) \quad (23)$$

$$G_y(X,Y,t) = (1 + E_y(X,Y))^* G_y(t) \quad (24)$$

where $G_x$ and $G_y$ are the nominal linear gradients described by equations 2 and 3, X,Y is the position in the slice at which the gradient is being measured, and $E_x$ and $E_y$ are the ratios of the non-linearities to the nominal linear gradients. $E_x$ and $E_y$ are presumed to be independent of the magnitude and direction of the net gradient field and are also presumed not to vary over time.

As explained above, the convolution back projection process maps particular spin phase patterns onto corresponding positions in the reconstructed image. The above formulas indicate the spin phase pattern which would be produced at position x,y by the theoretical gradient field patterns is displaced to position $x_{eff}$, $y_{eff}$ where $$x_{eff} = x^*(1 + E_x(X,Y)) \quad (25)$$

$$y_{eff} = y^*(1 + E_y(X,Y)) \quad (26)$$

Therefore, during the back projection step, non-linearities in the gradient fields can be corrected by substituting $x_{eff}$ and $y_{eff}$ for x and y.

Combining the corrections for non-linearities and non-uniformities, the error-corrected formula for back projection is:

$$A'(X,Y) = \Sigma_{k=1}^N Q(q_i = x_{eff}(X,Y) \cos \theta + y_{eff}(X,Y) y \sin \theta + B_d(X,Y), \theta_k) \quad (27)$$

where X,Y is the position of the point (x,y,z).

As those skilled in the art will appreciate, one result of applying the dewarping procedure in addition to the above described non-uniformity corrections is that the non-uniformities of the main field must be measured in terms of gradient coordinates (i.e., a coordinate system defined by isomagnetic gradient lines) because the non-linearity correction transforms the non-uniformity corrected image data from gradient coordinates to machine coordinates.

Figure 7:
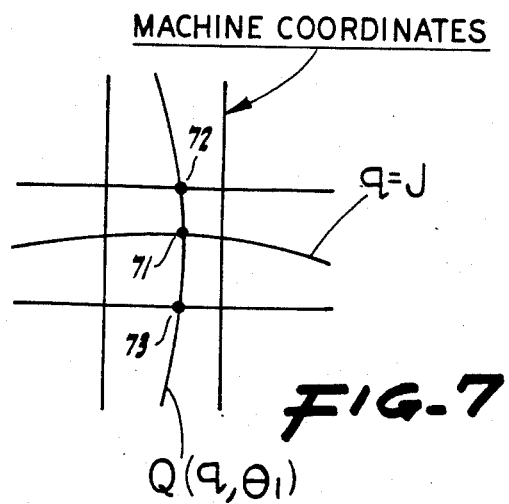
FIG. 7 is a graph showing the basic bilinear interpolation scheme utilized for transforming gradient coordinates to machine coordinates to make it possible to reconstruct an image despite the presence of non-uniformities in the main magnetic field and non-linearities in the gradient fields.

FIG. 7 shows a graphic illustration of the interpolation scheme represented by equations 17 and 18, above, when applying the above described correction for non-linearities in the magnetic gradient fields. In particular, the intersection of isomagnetic line q=J with the Q function determines the point 71 of the Q function to be projected onto the image. The value of the Q function at this point 71 is interpolated from the previously computed values of the Q function at points 72 and 73. This interpolation effectively transforms the image data from gradient coordinates to machine coordinates.

One benefit of the use of the spiral waveform imaging process is that the effect of T2 relaxation on the data collected, which is sometimes called T2 effects and tends to cause Lorentzian blurring of the image generated, is much less than would be the case using prior art NMR imaging techniques. The method of the present invention is believed to have less blurring due to T2 effects than other fast imaging methods, such as the Echo-Planar method of Mansfield (which uses unbalanced magnetic gradient signals and which Mansfield claims can be used to collect data over a longer portion of the free induction decay period than most other prior art methods).

T2 effects are one of the primary reasons that data ia collected during only a short portion of the free induction decay period in the prior art. The inventor has found that the spiral waveform imaging process automatically reduces the T2 noise effects so that it is possible to create good quality images using data from substantially the entire free induction decay period. Even in the preferred embodiment of the invention where an accelerated spiral waveform is used, it is prefered to use at least one third of the free induction decay period for data collection, which is substantially longer than the data collection period used in the prior art known to the inventor.

It can be seen from the foregoing that there has been provided an imaging method for nuclear magnetic resonance utilizing balanced gradient fields. It can be seen that with the present method, data can be collected during substantially larger portion of the free induction decay period than was possible using prior art techniques. As a result, fast imaging can be accomplished. In addition, it is possible to utilize the method in connection with magnet structures which provide a main field which has non-uniformities and gradient fields which have non-linearities therein. In the image reconstruction portion of the method of the invention, a modified convolution back projection can be utilized to minimize or eliminate the distortions that these non-uniformities in the main field and non-linearities in the gradient fields would otherwise cause to appear in the images.

The method of the present invention is particularly applicable to forming images of small vessels, as for example, the blood vessels in the heart and the brain of the human body. The imaging of small blood vessels is made possible by the large amount of data which can be collected during each free induction decay period. By obtaining much more data, it is possible to provide more precise images and more particularly images of small vessels.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

For example, as will be understood by those skilled in the art, the method of the present invention is equally applicable to imaging methods using a spin echo technique as it is to the method of the preferred embodiments. The spin echo technique affects only the step used for exciting the spins in the subject and not the technique used for collecting data after the excitation step.

As another example, the method of the present invention would applicable in an NMR system having gradient coils which generate magnetic gradient fields which are not mutually perpendicular. As will be understood by those skilled in the art, while gradient magnetic fields are traditionally generated along Cartesian coordinate axes, all that is required is that the system be able to control the gradient magnetic fields so as to generate substantially balanced gradient fields. Practically any three non-coplanar magnetic gradient coil system should be able to satisfy this requirement.

In yet another example, variations on the method of the present invention to correct for "chemical shift" and other effects are the type of modifications which can be expected to occur to those skilled in the art without departing from the true spirit and scope of the invention as defined by the appended claims.

Further, it should be noted that while to foregoing discussion comprises the best explanation known to the inventor as to why the invention works, the scope of the invention is to be limited only by the claims and not by the accuracy of this explanation of the theory of the invention.

What is claimed is:

1. In a method for forming an image of a subject by determining the relative densities of nuclei within the subject, applying a main magnetic field to the subject to create aligned nuclear spins in the nuclei in the subject, exciting the nuclei in a selected portion of the subject by simultaneously applying a magnetic gradient field and a magnetic radio frequency field to the subject, applying two substantially balanced time varying gradient magnetic fields to the subject along two preselected axes, detecting the precession of nuclear spins in the subject while said balanced magnetic gradient fields are applied, and forming an image from the detected information, wherein said gradient magnetic fields form a spiral spatial frequency pattern.

2. A method as in claim 1 together with the step of repeating the steps set forth so that a plurality of slices are imaged during substantially overlapping free induction decay time periods.

3. A method as in claim 2 in which an image is formed for each said slice based on information detected during a single free induction decay period.

4. A method as in claim 3 in which the duration said detecting step for each slice imaged is less than approximately 100 milliseconds.

5. A method as in claim 2 wherein each slice is imaged using information detected during more than one free induction decay period.

6. A method as in claim 1 in which said forming step includes reconstructing the image to minimize or eliminate the effect of non-uniformities in the main magnetic field.

7. A method as in claim 6 in which said forming step includes the step of minimizing the effect of non-linearities in the gradient fields.

8. A method as in claim 6 wherein the non-uniformities are minimized or eliminated by the use of a modified convolution back projection algorithm.

9. A method as in claim 1 wherein said balanced gradient magnetic fields form an accelerated spiral spatial frequency pattern is accelerated by increasing the amplitude and oscillation of said fields more rapidly than that of sinusoidally varying gradient fields having uniformly increasing amplitudes so that the time required for traversing said spiral spatial frequency pattern is less than the time required when using sinusoidally varying gradient fields having uniformly increasing amplitudes.

10. The method as set forth in claim 1, wherein
said step of forming an image uses a convolution back projection algorithm to process said detected information.

11. A method of imaging data collected from a subject being scanned by nuclear magnetic resonance means including the application of magnetic gradient fields, comprising the steps of:
exciting the spins of the nuclei in a selected portion of said subject;
applying a time varying magnetic gradient field to said selected portion of said subject so that the spatial frequency of the spins of the nuclei in said selected portion of the subject vary in a spiral manner in the spatial frequency domain corresponding to the phases of said excited spins;
collecting data, corresponding to the free induction decay signals generated by said excited spins in said subject, from evenly spaced points along each of a multiplicity of radially extending spokes emanating from a common point in said spatial frequency domain while performing said applying step; and
forming an image, from the data collected in said collecting step, using a convolution back projection algorithm.

12. The method as set forth in claim 11, further including the steps
successively repeating said exciting and collecting steps with a multiplicity of different slices of said subject during a period of time no longer than the average spin-lattice relaxation period associated with said different slices of said subject.

13. The method as set forth in claim 11, further including the step of:
applying de-spin pulses before said applying and collecting steps to damp signals generated by moving materials associated with the subject.

14. The method as set forth in claim 11, wherein:

said time varying magnetic gradient causes the spatial frequency of the spins of the nuclei of said selected portion of the subject to vary in a spiral manner in the spatial frequency domain corresponding to the phases of said excited spins.

15. A method as in claim 13, wherein
said gradient magnetic fields form an accelerated spiral spatial frequency pattern by increasing the amplitude and oscillation of said fields more rapidly than sinusoidally varying gradient fields having uniformly increasing amplitudes so that the time required for traversing said spiral spatial frequency pattern is less than the time required when using sinusoidally varying gradient fields having uniformly increasing amplitudes.

16. A method of imaging data collected from a subject being scanned by nuclear magnetic resonance means, comprising the steps of:
exciting the spins of the nuclei in a selected portion of said subject;
applying two balanced time varying gradient magnetic fields to said selected portion of said subject so that the spatial frequency of the spins of the nuclei of said selected portion of said subject vary in a spiral manner in the spatial frequency domain corresponding to the phases of said excited spins;
collecting a plurality of data values, corresponding to the free induction decay signal generated by said excited spins in said subject in a single spin-lattice relaxation period, from evenly spaced points along each of a plurality of radially extending spokes emanating from a common point in said spatial frequency domain, while performing said applying step; and
forming an image from the data collected using convolution back projection.

17. A method of imaging data collected from a subject being scanned by nuclear magnetic resonance means including the application of orthogonal magnetic gradient fields $G_x$, $G_y$ and $G_z$, comprising the steps of:
applying a magnetic gradient field $G_z$ during the application of an RF excitation pulse, the frequency of said RF excitation pulse and said gradient field $G_z$ being determinative of the slice of said subject from which data is to be collected;
applying pulses from the three orthogonally disposed time-varying magnetic gradients $G_x$, $G_y$ and $G_z$ for damping signals generated by moving materials associated with the subject;
collecting data, corresponding to the RF signals generated by the subject, while varying the $G_x$ and $G_y$ magnetic gradient fields so that the spatial frequency of the spins of the nuclei of a selected slice of the subject varies in a spiral manner; and
generating image data from the RF signals collected, said image data being useable for generating a display on a display system.

18. The method as set forth in claim 17, further including the steps of:
varying the frequency of the RF excitation pulse for selecting different slices of the subject; and
collecting data successively from a plurality of selected slices of said subject during a single predetermined period of time, said predetermined period of time being no longer than the average spin-lattice relaxation period associated with the slices of said subject which are being imaged.

19. The method as set forth in claim 17, wherein
said collecting step includes
collecting data at times corresponding to preselected spatial frequencies; and
said generating step includes
Fourier transforming the data collected at preselected sets of said preselected spatial frequencies.

20. The method as set forth in claim 17, wherein
said collecting step includes
collecting data at times corresponding to spatial frequencies along preselected spokes in the spatial frequency plane which corresponds to the selected slice of said subject; and
said generating step includes
convolving the data collected for each said spoke, thereby producing a transformed set of data for each said spoke; and
generating a data value for each point of an image by summing the contributions of each said transformed set of data to said point in accordance with a predetermined algorithm.

21. The method as set forth in claim 20, wherein
during said collecting step, a substantially uniform background magnetic field is applied; and
said predetermined algorithm includes an adjustment which is a predetermined function of the magnitude of the non-uniformity in the magnetic field at each point of said subject which is being imaged.

22. The method as set forth in claim 20, wherein
said predetermined algorithm includes an adjustment which is proportional to the magnitude of the non-uniformity in the magnetic field at each point of said subject which is being imaged.

23. The method as set forth in claim 20, wherein
said predetermined algorithm includes an adjustment which is a predetermined function of the magnitude of the non-linearity in said magnetic gradient fields $G_x$ and $G_y$ at each point of said subject which is being imaged.

24. A method as in claim 17, wherein
said gradient magnetic fields form an accelerated spiral spatial frequency pattern by increasing the amplitude and oscillation of said fields more rapidly than sinusoidally varying gradient fields having uniformly increasing amplitudes so that the time required for traversing said spiral spatial frequency pattern is less than the time required when using sinusoidally varying gradient fields having uniformly increasing amplitudes.

25. In a method of collecting and processing NMR data from a selected portion of a subject, the steps of:
varying the gradient of the magnetic field in said portion of said subject while collecting data after the generation of an RF excitation pulse, said magnetic field gradient varying in a prearranged fashion so that the spatial frequency of the spins in said selected portion of said subject varies in a spiral fashion within a spatial frequency plane corresponding to said selected portion of said subject; and
collecting, within a single free induction decay period, a plurality of data values from evenly spaced points along each of a plurality of radially extending spokes emanating from a common point in said spatial frequency domain.

26. In the method of claim 25, the step of:
collecting data only at times corresponding to selected angular positions in said spatial frequency plane.

27. In the method of claim 26, the steps of:
processing the data collected at each angular position in said spatial frequency plane using convolution back projection, and thereby generating a reconstructed image corresponding to the density of selected nuclei in said selected portion of said subject.

28. In the method of claim 27, said processing step including the steps of:
separately convolving the data collected at each selected angular position, $\theta_k$, in said spatial frequency plane, the resulting convolved data being represented as $$Q(q_i, \theta_k)$$

for each said spoke, k; and
back projecting said convolved data onto the reconstructed image by projecting for each spoke, k, a value proportional to $$Q(q_i = x \cos \theta_k + y \sin \theta_k + B_d(x,y)/k, \theta_k)$$

onto each point at position x, y in the reconstructed image, where $\theta_k$ is the angular position of the spoke with respect to the axes of the spatial frequency plane, $B_d(x,y)$ is the the amount of the non-uniformity at position x, y, and k is a constant related to the shape of the spiral spatial frequency pattern of the spins in the selected slice.

29. In the method of claim 28,
said back projecting step including back projecting said convolved data onto the reconstructed image by projecting for each spoke, k, a value proportional to $$Q(q_i = x_{eff} \cos \theta_k + y_{eff} \sin \theta_k + B_d(x,y)/k, \theta_k)$$

onto each point at position x, y in the reconstructed image, where $\theta$ is the angular position of the point x, y with respect to the axes of the spatial frequency plane, $B_d(x,y)$ is the the amount of the non-uniformity at position x, y; k is a constant related to the shape of the spiral spatial frequency pattern of the spins in the selected slice;
and where the non-linearities in the gradient magnetic fields can be characterized as $$G_x(x,y,t) = (1 + E_x(x,y)) * G_x(t)$$

$$G_y(x,y,t) = (1 + E_y(x,y)) * G_y(t)$$

where $G_x$ and $G_y$ are the nominal linear gradients in the x and y directions, and $E_x$ and $E_y$ are independent of the time and of the magnitude and direction of the net gradient field;
and where $$x_{eff} = x^a(1 + E_x(x,y))$$

$$y_{eff} = y^a(1 + E_y(x,y)).$$

30. A method as in claim 25, wherein
said gradient magnetic fields form an accelerated spiral spatial frequency pattern by increasing the amplitude and oscillation of said fields more rapidly than sinusoidally varying gradient fields having uniformly increasing amplitudes so that the time required for traversing said spiral spatial frequency pattern is less than the time required when using sinusoidally varying gradient fields having uniformly increasing amplitudes.

31. A method of imaging data collected from a subject being scanned by nuclear magnetic resonance means including the application of magnetic gradient fields, comprising the steps of:
exciting the spins of the nuclei in a selected portion of said subject;
applying a time varying magnetic gradient field to said selected portion of said subject;
collecting data, corresponding to the free induction decay signals generated by said excited spins in said subject, while performing said applying step;
successively repeating said exciting and collecting steps with a multiplicity of different slices of said subject during a period of time no longer than the average spin-lattice relaxation period associated with said different slices of said subject;
applying de-spin pulses before said applying and collecting steps to damp signals generated by moving materials associated with the subject; and
forming an image from the data collected in said collecting step;
said magnetic gradient field varying with time so that a plurality of data values are collected from each of a plurality of angular positions in the spatial frequency domain corresponding to the phases of said excited spins within a single free induction decay period.

* * * * *